(12) United States Patent
Williams

(10) Patent No.: US 6,631,508 B1
(45) Date of Patent: Oct. 7, 2003

(54) METHOD AND APPARATUS FOR DEVELOPING AND PLACING A CIRCUIT DESIGN

(75) Inventor: Anthony D. Williams, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 432 days.

(21) Appl. No.: 09/589,257

(22) Filed: Jun. 7, 2000

(51) Int. Cl.$^7$ .............................................. G06F 17/50
(52) U.S. Cl. ................................ 716/8; 716/9; 716/10; 716/11
(58) Field of Search ...................................... 716/1–14

(56) References Cited

U.S. PATENT DOCUMENTS

| | | | | |
|---|---|---|---|---|
| 5,696,693 A | * | 12/1997 | Aubel et al. ................... | 716/12 |
| 5,974,241 A | * | 10/1999 | Fusco .............................. | 716/2 |
| 6,086,629 A | * | 7/2000 | McGettigan et al. .......... | 716/10 |
| 6,145,117 A | * | 11/2000 | Eng ............................... | 716/18 |
| 6,170,080 B1 | * | 1/2001 | Ginetti et al. .................. | 716/18 |
| 6,223,190 B1 | * | 4/2001 | Aihara et al. .......... | 348/207.99 |
| 6,226,780 B1 | * | 5/2001 | Bahra et al. ................... | 716/18 |

* cited by examiner

Primary Examiner—Matthew Smith
Assistant Examiner—Sun James Lin
(74) Attorney, Agent, or Firm—LeRoy D. Maunu; Edel M. Young; Justin Liu

(57) ABSTRACT

A method and apparatus for developing placement characteristics of a circuit design in conjunction with developing functional aspects of the circuit. In various embodiments, an application programming interface (API) is programmed in a hardware definition language (HDL). The API provides placement directives that can be called from the HDL code that defines functional characteristics of the circuit. The API can also be used in a testbench in order to analyze both the functional and physical placement characteristics of the design. Since the API is programmed in HDL, the placement generated during the implementation phase is the same as the placement analyzed during functional simulation.

29 Claims, 7 Drawing Sheets

METHOD AND APPARATUS FOR DEVELOPING AND PLACING A CIRCUIT DESIGN

CROSS-REFERENCE TO RELATED APPLICATIONS/PATENTS

This application relates to the following U.S. patent applications:

"CONTEXT-SENSITIVE SELF IMPLEMENTING MODULES" by Dellinger et al., filed on Mar. 27, 1998, application Ser. No. 09/049,891; and "METHOD FOR REMAPPING LOGIC MODULES TO RESOURCES OF A PROGRAMMABLE GATE ARRAY" by Hwang et al., filed on Jan. 19, 1999, application Ser. No. 09/234,010.

The above-identified applications/patents are assigned to the assignee of the present invention and incorporated herein by reference.

FIELD OF THE INVENTION

The present invention generally relates to electronic circuit design tools, and more particularly to assisting a designer in the process of developing physical implementation characteristics of a circuit in conjunction with developing the logical characteristics of the circuit.

BACKGROUND

Field programmable gate arrays (FPGAs), first introduced by XILINX in 1985, are becoming increasingly popular devices for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability.

As FPGA designs increase in complexity, they reach a point at which the designer cannot deal with the entire design at the gate level. Where once a typical FPGA design comprised perhaps 5,000 gates, FPGA designs with 50,000 gates are now common, and FPGAs supporting over 300,000 gates are available. To deal with this complexity, circuits are typically partitioned into smaller circuits that are more easily handled. Often, these smaller circuits are divided into yet smaller circuits, imposing on the design a multi-level hierarchy of logical blocks.

Libraries of pre-developed blocks of logic have been developed that can be included in an FPGA design. Such library modules include, for example, adders, multipliers, filters, and other arithmetic and DSP functions from which system designs can be readily constructed. The engineering community sometimes refers to these previously created designs as "design modules", "cores" or "IP" (intellectual property). The use of pre-developed logic cores permits faster design cycles by eliminating the redesign of circuits. Thus, using cores from a library may reduce design costs.

Developing logic cores that are suitable for various applications is challenging because many high-performance FPGA circuits require customized layouts to achieve required performance levels. While various methods are available that allow a logic core designer to exercise various levels of control over the layout of a core, the effort required of the core designer is considerable when high-level hardware description languages are used.

Hardware description languages (HDL) such as VHDL are often used in creating logic cores. An advantage of using HDL is that the circuit can be defined using high-level abstract statements, thereby allowing the specification of complex functions. After the function of a core has been specified in HDL and compiled, the designer verifies correct operation of the core using a simulator such as ModelSim in conjunction with a test bench. This simulation is called a functional simulation and is used to uncover the logical errors in a design. After discovering a logic error, the designer changes the HDL code to fix the problem(s), and again performs a functional simulation. The process is repeated until the designer is satisfied with the logic. During the phase of development that includes design capture and functional simulation, the physical characteristics of the design are generally not examined. Not until the next phase of development, which is the implementation phase, is it known whether the design will satisfy various physical parameters such as chip area and timing. During the implementation phase, the design is synthesized into a lower-level, technology-specific representation, such as an FPGA or ASIC netlist. For FPGAs, the implementation phase also includes mapping the netlist to particular configurable resources of the device. The mapped design is then simulated (physical simulation) to verify that the mapped design retains all the logical characteristics of the original HDL specification, and that the physical aspects of the mapped design have not introduced any new, undesirable, logical characteristics.

If errors are discovered in physical simulation or if the timing data does not satisfy the required timing constraints, the design must be modified. One difficulty in changing the design at this phase is that the HDL design has been translated to a netlist, and information from the physical simulation is in relationship to the netlist. Thus, in order to resolve a problem the designer must manually trace the netlist back to the original HDL. As further steps in the implementation phase are performed, for example, optimization and place-and-route, the resulting representation of the design becomes further removed from the original HDL. Significant effort may therefore be required to resolve problems identified later in the implementation phase.

Physical problems associated with a design, for example, timing and placement, can often be traced back to the high-level specification of the circuit design. However, timing and placement problems are generally discovered during the implementation phase of the design process where correlating a physical problem with a particular portion of a high-level specification can be a laborious procedure. The numerous transformations of the high-level design into other lower-level representations makes very difficult tracing back low-level design features to high-level design statements.

A method that addresses the aforementioned problems, as well as other related problems, is therefore desirable.

SUMMARY OF THE INVENTION

In various embodiments, the invention provides a circuit designer with the means to visualize and control certain aspects of the design's physical implementation in the context of the original high-level design definition.

In various embodiments, an application programming interface (API) is programmed in a hardware definition language (HDL). The API provides placement directives that can be called from the HDL code that defines functional characteristics of the circuit. The API can also be used in a testbench in order to analyze both the functional and physical placement characteristics of the design. Since the API is programmed in HDL, the placement generated during the implementation phase is the same as the placement analyzed during functional simulation.

The invention supports manipulation of objects in a design's logical hierarchy to produce a separate physical hierarchy of objects. Placement directives can then be applied to the objects in the physical hierarchy for specifying a physical layout. While adherence to a design's logical hierarchy is seldom suitable for physically placing objects of the design, individual objects at different levels in the logical hierarchy may be convenient for identifying objects and grouping the objects into a separate physical hierarchy. Thus, the invention provides a convenient method for using objects of the logical hierarchy to create a separate physical hierarchy, and directing placement relationships between the objects in the physical hierarchy.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

DETAILED DESCRIPTION

The present invention is believed to be applicable to a variety of processes for developing electronic circuit designs. An example environment for creating designs for field programmable gate arrays (FPGAs) is used to describe different embodiments of the invention. While the present invention is not so limited, an appreciation of the present invention is presented by way of specific examples involving FPGAs.

In the various embodiments of the invention, placement directives are elevated to an abstract level that is transportable between device technologies. Specifically, a design created using techniques of the present invention is transportable between device technologies without requiring modification to the design's physical placement directives. The invention thereby supports re-use of design code.

Figure 1:
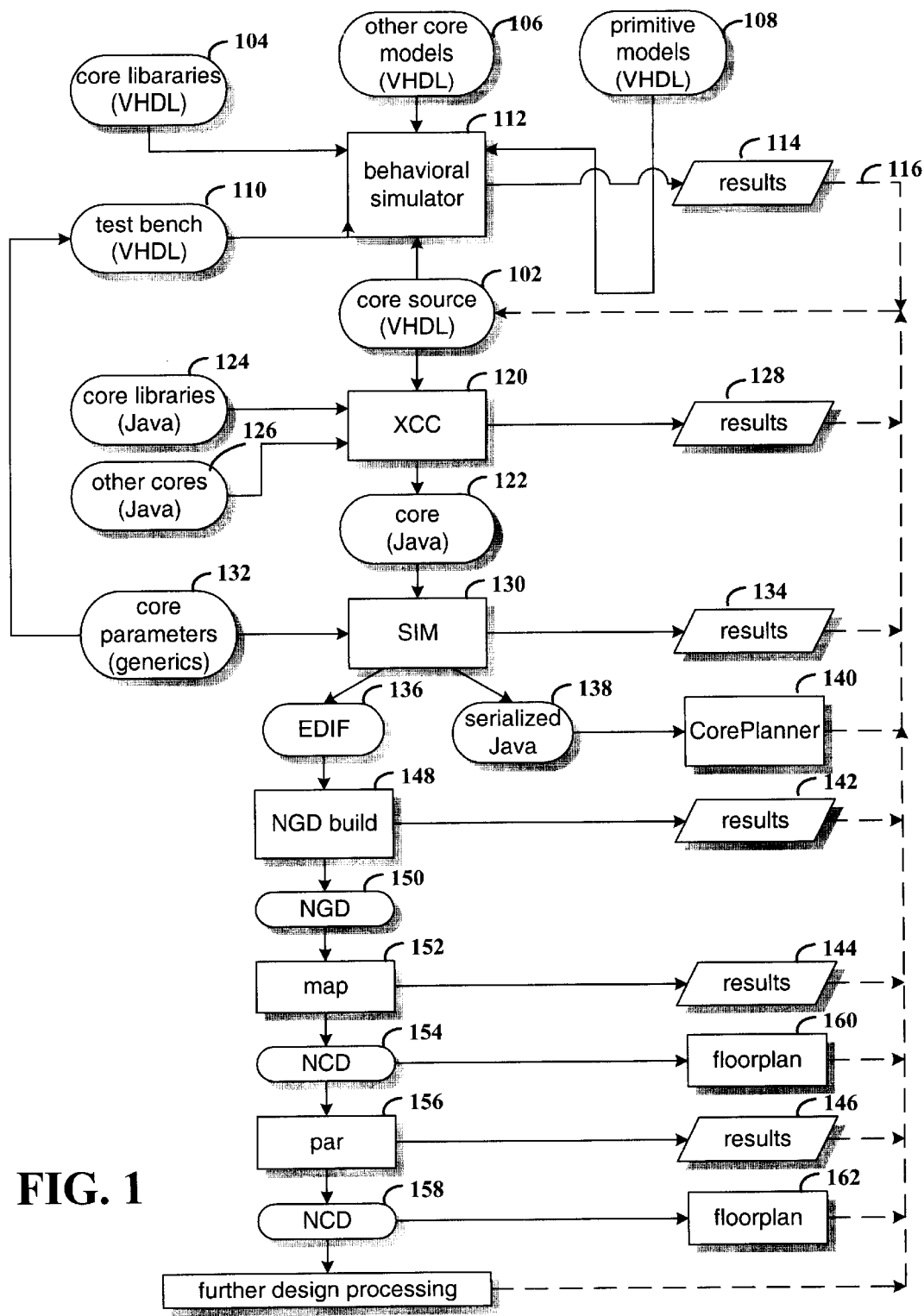
FIG. 1 is a flow diagram of a process for creating a logic core.
Figure 2:
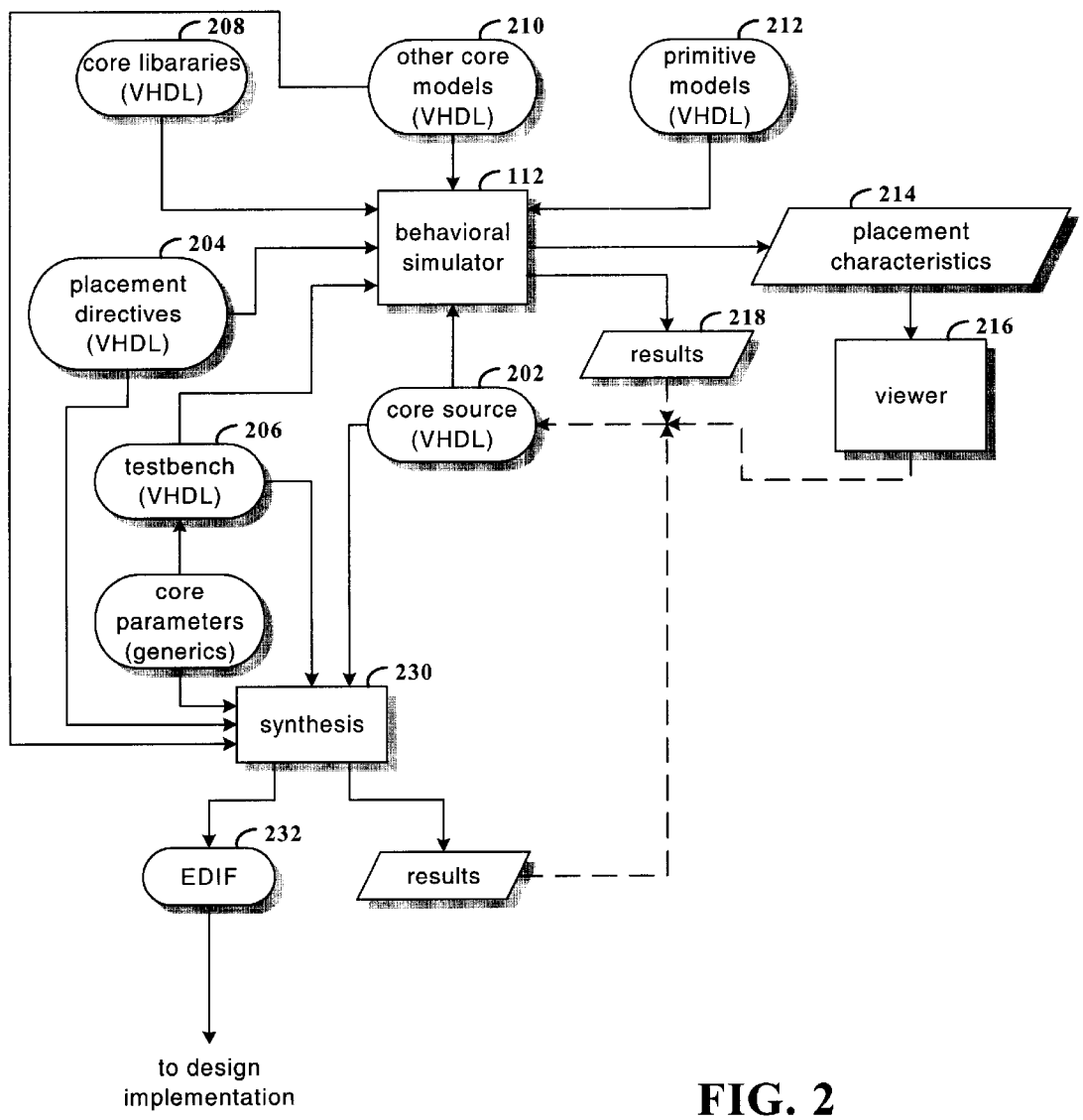
FIG. 2 is a flow diagram of the process of creating a logic core in accordance with one embodiment of the invention.

FIG. 1 is a flow diagram of a process for creating a logic core. In a typical scenario, a designer will modify core source code 102 when problems are detected at various points in the flow. The dashed lines in FIGS. 1 and 2 illustrate the points in the design flow where the designer may decide to revisit the core source code having discovered issues with the design. Problematic issues may be revealed by any of the process steps in design development, including logical simulation, core-compilation (XCC), implementation, physical inspection (floorplanner), or physical simulation.

After modifying core source code 102, all processing steps completed thus far will need to be repeated. Finding and fixing problems late in the process is laborious, and results from later processing stages are difficult to correlate with the original core source code.

In developing a logic core, core source code 102 is specified in a hardware description language (HDL) such as VHDL, for example. Core source 102 may rely on core libraries 104 (also referenced as "libraries of core building blocks, useful functions and other facilities"), other cores 106, and primitive models as known to those skilled in the art. Testbench 110 is developed in conjunction with core source 102 for testing whether the logic of the core source functions as required. The various logic modules 102, 104, 106, 108, and 110 are input to behavioral simulator 112 (e.g., ModelSim software from Model Technology) for performing a functional simulation. The results 114 of the simulation can be output to either a file or to a computer monitor. Dashed line 116 leading from results 114 back to core source 102 represents changes to be applied to the core source in response to the particular results. After the core source has been updated, the simulation is repeated to verify logical correctness. This process is repeated until the core exhibits the desired logical functionality.

After functional simulation of the core source has completed successfully, the process continues with synthesis and further simulation using the testbench. In an example design environment, the Xilinx Core Compiler (XCC) 120 is used to generate a Java-based expression of the core 122. The Java-based core is a self-implementing module (SIM), as described in the related patent/application. When a SIM is executed, the design is elaborated to produce a netlist, and optionally, placement and/or routing information. Various Java-based core libraries 124 and other Java-based cores 126 can be used in combination to generate core 122. Compilation results from XCC 120 are output as results 128. Based on the compilation results, the original core source 102 may require modification and the entire process repeated.

SIM block 130 is Xilinx software that supports execution of the Java core 122. Various core parameters (e.g., area or speed oriented optimization, bit width, and latency) 132 are used by SIM 130 in support of the Java core 122. Result information, such as the status of the core compilation process, is output by SIM 130 as block 134. The particular information comprising results 134 may be used in evolving the original core source 102.

SIM block 130 represents a library of program code that is capable of "executing" the Java expression of a core that is produced by the XCC block 120. In combination, the Java expression of the core 122 and the supporting library of program code 130 are capable of executing as a program on a computer having a Java interpreter. No parameters are requested of the user by SIM block 130. Instead, when SIM block 130 is used to elaborate (execute) the Java expression of the core, the core directs the SIM block to solicit from the user the parameter values to be used during elaboration. The elaboration process is the process that produces the serialized expression 138 and EDIF expression 136 of the core. SIM block 130 enables the elaboration process to take place, but it is core 122 that steers the elaboration process in a manner that is unique to each core. SIM 130 generates EDIF netlist 136 and serialized Java 138 from execution of Java core 122. Serialized Java is an alternative expression of Java program code, which is required by CorePlanner 140. Core-Planner 140 is a tool that is used to illustrate a core's physical characteristics, assuming the core has some physical characteristics to view. At this stage, a core's physical characteristics, if any, were introduced either by manually editing core Java code 122 to add physical layout information, or by using placement directive instructions in the core source code 102. The present invention involves using placement directive instructions in the core source code 102.

It will be appreciated that when the circuit design reaches the EDIF netlist 136 representation, the design has undergone substantial transformations such that relating elements within the netlist 136 to the corresponding elements of core source 112 may be very tedious and time-consuming. Therefore, results 142, 144, and 146 may be difficult to analyze in terms of the design expressed in core source 102. NGD build element 148 is a Xilinx tool that builds NGD database 150 from EDIF netlist 136, and map element 152 is a Xilinx software tool that maps the design to programmable resources of an FPGA, for example. Map element 152 generates NCD element 154, which is a database having the design objects associated with programmable resources of the FPGA. Place-and-route element 156 generates a placement for design objects on specific programmable resources of an FPGA and generates a signal routes between the design objects, both of which are associated with the design objects in NCD database 158. Floorplanning tools 160 and 162 can be used to analyze physical placement of the design. However, the analysis is complicated by the lack of correlation between the post-NGDBuild/MAP/PAR representation and core source specification.

FIG. 2 is a flow diagram of the process of creating a logic core in accordance with one embodiment of the invention. The diagram illustrates how placement characteristics are made available for analysis prior to synthesis of the design. The placement characteristics that can be analyzed prior to synthesis are specified in core source 202 using placement directives 204, which are procedures and functions coded in VHDL, for example. It will be appreciated that placement directives 204 may also be used by testbench 206, core libraries 208, other core models 210, and primitive models 212.

The procedures and functions of the placement directives 204 provide support to core logic designs and associated test benches for specifying placement and viewing the placement during logic simulation. Since the placement specification is written in a standard HDL (e.g., VHDL), the placement specification can be processed by behavioral simulator 112 without any special adaptations. Furthermore, the same placement specification that is processed through synthesis is processed during functional simulation, thereby allowing the placement to be previewed and analyzed prior to synthesis.

In addition to procedures and functions for specifying the placement of a design, the placement directives also include procedures and functions for generating viewable placement characteristics 214. Both the physical hierarchical relationship between design objects and a floorplan are represented in the placement characteristics. In one embodiment, the placement characteristics are represented in HTML code. Those skilled in the art will appreciate that various other standard or proprietary methods could be used to represent the placement characteristics.

With viewer 216, the placement characteristics 214 associated with testbench 206 and core source 202 can be analyzed in conjunction with the results 218 of the behavioral simulation. The availability of placement characteristics during functional simulation and the ability to analyze the placement in graphical form at that time provides the designer with the flexibility to evolve the placement of the design in parallel with the design logic prior to synthesis. Since the placement characteristics are correlated with core source 202 and testbench 206, the designer is relieved from tracing place-and-route results (e.g., FIG. 1, 146) back to the original source. Dashed line 220 represents modifications to the core source based on analysis of placement characteristics 214 and results 218.

The process then continues with synthesis of the design with synthesizer 230. Synthesizer 230 is a conventional software tool that is adapted to synthesize the logic of core source 202, generate placement annotations for the EDIF netlist 232, and not generate netlist elements for the placement directives 204. The process then continues with conventional processing to implement the design. It will be appreciated that in other embodiments, the synthesis and implementation phases may include elements from the design flow of FIG. 1, such as XCC 120, SIM 130, for example.

Figure 3:
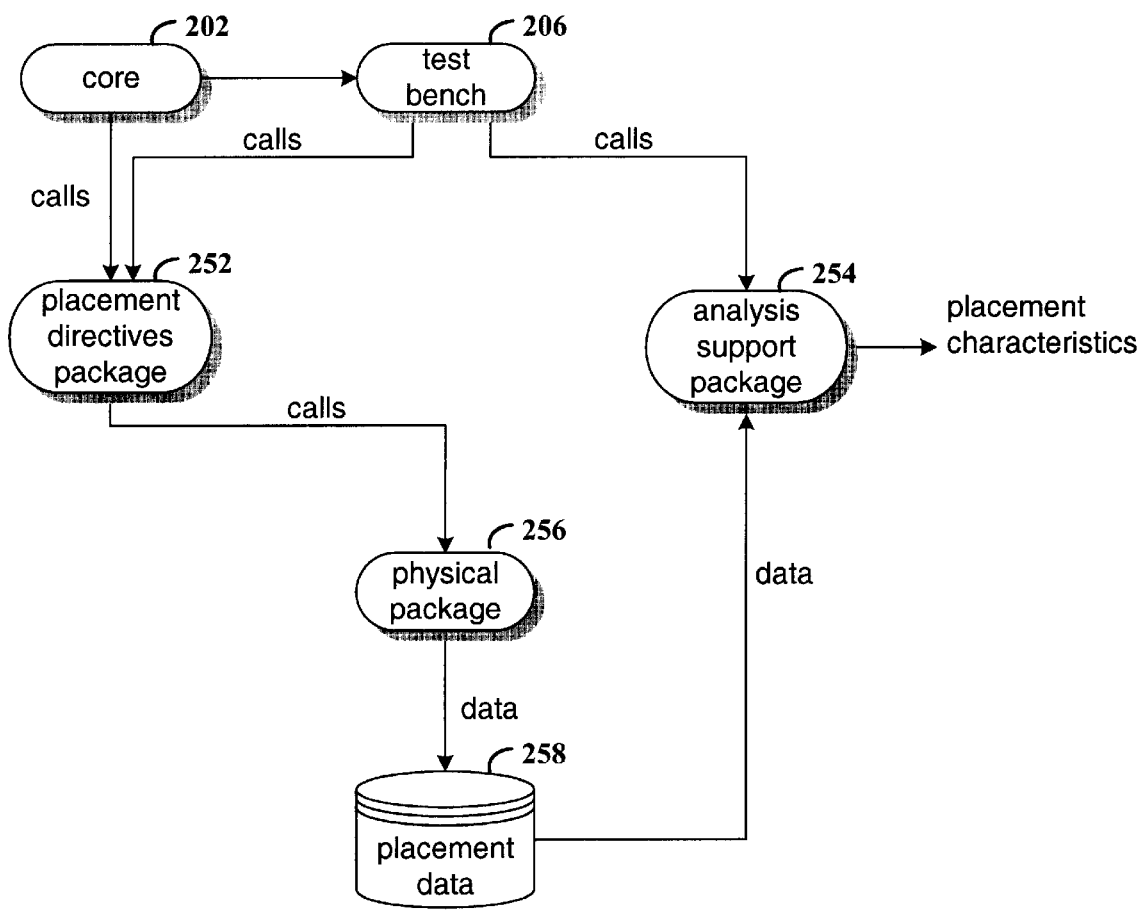
FIG. 3 is a functional block diagram that illustrates the relationships between the HDL packages that support the present invention.

FIG. 3 is a functional block diagram that illustrates the relationships between the HDL packages that support the present invention. The HDL packages illustrate an example implementation, while other HDL implementations will be recognized by those skilled in the art.

The functions and procedures for specifying placement and supporting floorplan analysis prior to synthesis are implemented in three VHDL packages: placement directives package 252, analysis support package 254, and physical package 256. Placement directives package 252 includes application programming interface (API) procedures and functions for core 202 and testbench 206 for specifying the placement of design objects. The procedures and functions of placement directives package 252 call procedures and functions of physical package 256, which generate placement data 258 for a specific target device. It will be appreciated that physical package 256 could be adapted to include procedures and functions specific to different types of devices (e.g., different families of FPGAs). Alternatively, separate packages could be constructed to accommodate different types of devices, for example, ASICs and CPLDs.

Placement data 258 indicates placement of the design objects of core 202 and testbench 206. One embodiment of the placement data is described below in connection with the descriptions of placement directives package 252 and the physical package 256. The placement data is available for further analysis via functions and procedures of analysis support package 254, which can be called from testbench 206. In one embodiment, calls to analysis support package 254 generate placement characteristic in the form of an HTML file, which can be viewed with browser software, for example. In other embodiments, analysis support package 254 generates output in the form of character data piped to a display terminal, or data formatted specifically for other viewer software.

Placement Directives Package

The following code describes placement directives package 252 in accordance with one embodiment of the invention. The procedures and functions of the placement directive package provide support to core logic designs and associated test benches for specifying placement and viewing the placement during logic simulation. Descriptions of the data objects that are used by the placement directives precede the code for the data objects.

The placement directives use a data structure referred to as a "container" to store various design objects. A typical logic design includes many design objects, and the design objects may be further subdivided into some number of subordinate design objects. This property is known as "design hierarchy". Descending through the design hierarchy (i.e., continually expanding design objects into constituent design objects) ultimately reveals design objects that can be expanded no further. These objects are known as "primitive" design objects, or "primitives" for short.

This type of design hierarchy is known as a "logical design hierarchy" since the logic of a design is partitioned along functional boundaries. The most complex functions are found toward the top of the hierarchy, and the simplest functions (the primitives) are found at the bottom of the hierarchy. The partitions in a logical design hierarchy can be chosen arbitrarily, but usually follow the major functional divisions within the design. It will be appreciated that matters relating to physical layout are typically ignored in choosing a logical design hierarchy. A logical design hierarchy is developed for the purpose of partitioning the design's considerable complexity into manageable pieces.

It may appear desirable to use the design's logical hierarchy to issue commands that control the design's physical layout. For example, it may be desirable to place all the logic in a selected part of the design hierarchy in the top, lefthand corner of the device. The logical hierarchy provides a convenient target for issuing placement commands.

However, since the purpose of the logical hierarchy is to partition the design into manageable functional blocks, it may not be suitable for the purpose of issuing placement commands. Placement is unlikely to have been foremost in the designer's mind when the logical hierarchy was conceived. To attempt to use the logical hierarchy in this manner may prevent the efficient expression of placement directives.

The present invention provides a technique for grouping pieces of the design together (or breaking them apart) for the purpose of succinctly stating relative placement relationships between them. "Containers" are used to describe the physical characteristics of the design by grouping pieces of the design.

A container is a structure that may be imposed on the design independently of the logical design hierarchy. Containers provide the means to group design objects to facilitate the issuance of physical placement directives. Comparable to the logical design hierarchy, the physical hierarchy (sometimes referred to herein as the "container hierarchy") can be constructed arbitrarily, but will typically follow broad physical divisions within the design.

The logical design hierarchy forms the initial basis of the physical hierarchy, but may be adapted through the use of the 'create_container' command (described below). Design objects are allocated to parent containers by identifying their unique position in the design's logical hierarchy. When a design object is assigned to a container in this fashion, a placement relationship must be provided to establish the object's position with respect to the other objects assigned to that container. Placement relationship commands are also described below.

A container is a 2-dimensional, square or rectangular boundary that has dimensions sufficient to enclose any containers designated as its "children". The dimensions of the child containers and the placement relationships that have been established between the children containers dictate the dimensions of the parent.

A container may have 0 or more child containers. A container that has no children is called a "primitive container", and the dimensions of a primitive container may be ascertained by requesting the dimensions of the primitive design-object it encloses.

Descending through the physical design hierarchy (container hierarchy) reveals containers with no children. Since the dimensions of these containers are known (provided by physical package 256) then the layout of the entire design can be established by examining the placement directives for all the primitive design objects.

Whenever an object is instantiated, its container may be "rotated" by 0, 90, 180, or 270 degrees, and may be "reflected" horizontally, vertically, or horizontally-and vertically, before being placed in the parent design floorplan. Such translations may be added together before being applied to a container. The resulting translation is the equivalent of having applied each translation individually and sequentially to the selected container. Translations are useful, for example, when adding a predefined circuit design module to a system design. Some manipulation of the circuit design module (or elements thereof) may be needed to construct an overall floorplan. As used herein, "rotate" refers to turning the floorplan of an object about the origin of x and y axes, and "reflect" refers to turning the floorplan of an object about an axis.

One major factor in determining how to place a circuit module into the floorplan of a parent design is the rectangular dimensions of the module. If the available space in the parent design is tall and thin and the floorplan of the circuit module is short and wide, a 90 degree rotation of the circuit module's floorplan may assist in adding the module to the parent floorplan. However, there may be situations where a rotation is insufficient.

For example, if the available space in the parent floorplan is tall and thin and the circuit module is also tall and thin, the circuit module would appear to fit into the available space. However, if the data flow through the module is opposite that of the parent floorplan, for example, the module is left-to-right and the parent floorplan is right to left, a simple rotation of the circuit module by 180 degrees reverses the connections (the connections on top of the module are rotated to the bottom). Instead of rotating the module, the module can be "reflected" that is rotated along the vertical axis by 180 degrees before placing the module into the parent floorplan.

A rotation and/or reflection may be applied to any container. The rotation/reflection modifies the placement relationships between the contents of the container (i.e., the children) consistent with the requested reflection/rotation. For example: If container A has child containers AB and AC, and the placement relationship that exists between them is "place AC to the right of AB", then requesting a rotation 90 degrees clockwise of container A would result in the new placement relationship "place AC below AB". The dimensions of the container A would change accordingly.

The rotation and reflection directives, examples of which are set forth below, provide control over the layout of a complex physical structure without having to manipulate the placement relationships within the physical structure.

TYPE rotation_type IS (no_rotation, ninety_degrees, oneeighty_degrees, twoseventy_degrees);

TYPE reflection_type IS (no_reflection, horizontal, vertical, horizontal_and_vertical);
TYPE translation_type IS RECORD
   rotation:rotation_type;
   reflection:reflection_type;
END RECORD translation_type;
—Abbreviations—
CONSTANT no_translation:translation_type:=
   (no_rotation, no_reflection);

Whenever an object is instantiated, its container may be placed with respect to another container in the design. Placement-relationships between containers consist of a relative placement (above, below, to_left_of, to_right_of) and an alignment (left_aligned, right_aligned, center_aligned, top_aligned, bottom_aligned). Example VHDL TYPE definitions that are used to implement the placement relationships are set forth below.

```
TYPE alignment_type IS    (left _aligned, center_aligned,
                          right_aligned, top_aligned,
                          bottom_aligned, no_alignment);
TYPE placement_type IS    (above, below, to_left_of,
                          to_right_of, \with\ );
TYPE relationship_type IS RECORD
    placement    : placement_type;
    alignment    : alignment_type;
    boundary     : boundary_type;
END RECORD relationship_type;
```

The dimensions and coordinates of a container (measured in the base units defined in the physical package) are grouped into composite data types. The units in which dimensions are measured are the fundamental units defined for the target device. For example, the family of Virtex FPGA devices uses CLBs as the fundamental unit. Dimensions are measured in whole units. For example:

```
TYPE abstract_dimensions_type IS RECORD
         width    : INTEGER;
         height   : INTEGER;
    END RECORD abstract_dimensions_type;
TYPE abstract_coordinate_type IS RECORD
         x : INTEGER;
         y : INTEGER;
    END RECORD abstract_coordinate_type;
```

The placement directives allow placement relationships between containers to be defined before the containers are defined. Thus, when a placement relationship is declared between containers that are not yet defined, the relationship is held in a temporary queue until the containers have been declared. If elaboration is complete and there are relationships that remain on the temporary list, an error is detected and reported to the user.

Elements or objects of the design's logical hierarchy are used as the basis of the design's physical hierarchy. However, the logical hierarchy can be adjusted if it's found to be inappropriate for the desired physical placement strategy. Whenever such adjustments are issued by the user, they are recorded once the entire logical hierarchy has been constructed. The adjustments are then applied to the logical tree to create the physical tree.

The procedures and functions ("commands" for short) comprising the placement directives fall into three sub-categories based on the contemplated usage: library support, design support, and analysis support. Commands used for library support find use in defining a library of primitives for use with a particular target device technology. For example, a version of the UNISIM library exists which includes calls made to the library support commands.

The UNISIM library is the collection of design objects that are recognized as being "primitive" for any Xilinx architecture. For example, a flip-flop is a primitive design object. Since the UNISIM library contains all the primitive components for all Xilinx device architectures, only a subset of the components in the UNISIM library will be appropriate for a particular architecture. Thus, the version of the UNISIM library referenced above contains only the primitives recognized by a particular device architecture, for example Virtex. The primitive components have been annotated with physical dimensions in the manner required by the placement system. The resulting UNISIM primitives are placeable using this placement scheme.

Commands used for design support define the placement of primitives and other more complex structures during application-level design. These commands will typically be used throughout the structural segments of a design to control their relative placement.

The analysis support commands are used for analyzing a design's physical properties. These commands can be used in a design testbench in conjunction with conventional simulator directives. The input and output parameters and functions of the placement directive commands are described below.

The create_container procedure creates a new container with the name provided. The optional translation parameter allows the designer to specify the rotation and/or reflection from the default orientation that was assumed when the container's contents were originally placed. The input parameter, new_container_name, is the name of the new container, and the optional input parameter, translation, is the translation to be applied to any containers placed within this container.

The place procedure takes the names of two containers and attempts to establish the indicated relationship between them. If either or both of the containers have yet to be created, then the relationship is placed on the list of unclaimed relationships and implemented at a later time. The optional input parameter, condition, is a Boolean flag that may be used to enable or disable the placement relationship from being issued. If no flag is provided, the condition is assumed to be TRUE. The input parameter, a, is string that names the container that is to receive the relationship. The input parameter, r, sets for the nature of the relationship (relationship_type or placement_type) between the two containers. The relationship may be a complete relationship_type, or abbreviated to a placement_type only. The latter option is only applicable when placing primitive containers. The input parameter, b, is a string that names the container that is to be related to container a.

The iteration function can be used in two modes. No iterator parameter is used in the first mode, and the function identifies the whereabouts of the rightmost pair of enclosing parentheses within a string and replaces the characters within with a string representation of the integer parameter, i. The modified version of the string is returned by the function. The iterator parameter is used in the second mode, and the function identifies the location of the rightmost occurrence of the iterator string in the string parameter, path. A substring parameter, consisting of a string representation of the integer parameter, i, is enclosed in braces and inserted into path immediately after the occurrence of the iterator. The modified version of the path is returned by the function. The "+" function combines two translations such that the resulting translation is equivalent to having performed each translation sequentially. The parameter, L, is one of the translations, and the parameter, r, is the other translation to be combined. The function returns a translation_type that is the result of combining the two translations. This is an abstract function whose purpose covers all physical devices. An example of the usage of this function would be: rotate_right_90_degrees+rotate_right_90_degrees=rotate_180_degrees.

The add_child procedure is used to indicate that a container is a child of a specific parent container. For example, the add_child procedure can be used when it is desirable to adjust the design's physical hierarchy from its default organization, wherein the default physical hierarchy is identical to the design's logical hierarchy. A container can be made a child of any other container with the add_child procedure. The parameter, parent, identifies the container that is to receive the container identified by the parameter, child. This procedure adds the new relationship to the list of adjustments that need to be made to the design's physical hierarchy once elaboration is complete.

The calculate_container_dimensions procedure calculates the dimensions and locations of the children of each of the containers in a design. The procedure recursively descends through the container hierarchy and calculates the dimensions and locations of each container's children.

The process for calculating the dimensions of a container involves traversing the physical design hierarchy (container hierarchy) in a recursive fashion. The following steps outlines a recursive procedure that begins with the highest-level container:

1. Does this container have any primitive child containers? If so, call the physical package to obtain the dimensions of the primitive(s).
2. Does this container have any non-primitive child containers having unknown dimensions? If so, descend into each child container in turn (commencing at step 1).
3. At this step, the dimensions of all the child containers are known. The placement relationships between the children containers are used to establish the dimensions of the highest-level container. Calls are made to the physical package to determine the area required when two primitive containers are placed side by side.

Examples of the physical package procedures that are called during the above process are: create_new_floorplan_element and place_primitives.

The database 258 that maintains the information about the physical location of the design's primitives consists of a map of an empty chip. The map's dimensions are adjusted while performing the calculate_container_dimensions procedure described above so that the map is always just big enough to hold the full extent of the layout. Every time a new primitive is added to the map, a floorplan element must be there to receive it. A floorplan element is essentially a place-holder for primitives. For example, in the case of a Virtex FPGA, the floorplan element is a CLB. For other devices, the floorplan element is something different. Once a floorplan element is available at the desired coordinate, the place_primitives command is used to place the specified primitive in the floorplan element (an error occurs if the floorplan element already contains a primitive). The calculate_container_dimensions procedure should be called only after ensuring that all concurrent commands launched during elaboration have finished executing. The commands used during elaboration are those from the abstract package. The commands of the abstract package are used to assign primitives to containers and to establish placement relationships between the containers.

The calculate_container_dimensions procedure should be called from the testbench associated with the circuit design prior to issuing any commands that display or generate a representation of the floorplan of the design.

The following paragraphs describe data structures and procedures of the physical package in accordance with one embodiment of the invention. The procedures of the physical package are called by the procedures of the placement directive package as described above.

Boundary types are used to indicate the extent of placed objects. For example, the object may end on a CLB boundary, a slice boundary, or a logic element boundary. A placement bias variable is used for expressing where in a CLB a primitive is to be placed. For example, a placement directive can specify that the primitive can be placed at the top, bottom, left, or right in a CLB. The following paragraphs are specific to the Xilinx Virtex architecture, since they describe the organization of the database used to hold the physical layout of a design targeted to Virtex. Those skilled in the art will appreciate that alternative layouts could be constructed for other devices.

The placement directives for a design are used to specify a hierarchical relationship of placement data. Physical placement information is recorded by allocating the design's primitives to CLBs. Information accompanying and related to the physical requirements each primitive makes it possible to assign the primitive to a physical site(s). Each CLB is represented with a data structure having placeholders for the legal sites. In one embodiment, the CLB data structure is defined as:

physical_container_type includes:
  muxf6_status is a Boolean flag that indicates whether the CLB's MUXF6 site is occupied; and
  slices is an array having 2 pointers to data structures that record information about the contents of the CLB's two slices (slice_type).

slice_type includes:
  muxf5_status is a Boolean flag that indicates whether the slice's MUXF5 site is occupied; and
  logic_elements is an array of pointers to data structures that record information about the contents of the slice's two logic elements (logic_element_type).

logic_element_type includes:
  lut_status is a Boolean flag that indicates whether the logic element's LUT is occupied;
  flop_status is a Boolean flag that indicates whether the logic element's FLOP is occupied;
  muxcy_status is a Boolean flag that indicates whether the logic_element's MUXCY is occupied;
  xorcy_status is a Boolean flag that indicates whether the logic element's XORCY is occupied; and
  mult_and_status is a Boolean flag that indicates whether the logic element's MULTAND site is occupied.

Since a floorplan is actually a grid arrangement of CLBs, a floorplan_element is considered to be a placeholder for a CLB. A floorplan_element data structure includes a physical_container and pointers to adjacent (north, south, east, west) floorplan_elements in order to impose a grid layout on the floorplan.

Since the order in which a container's dimensions are evaluated is from the bottom of the physical hierarchy towards the top, individual container's floorplans are held in a temporary list structure prior to being joined together.

For the particular device supported by the physical package, various site information is maintained that describes the physical floorplan of the device. The following site information includes data structures pertaining to CLBs, slices, and logic elements, which are applicable to a Virtex FPGA, for example. Those skilled in the art will recognize that other primitives could be used for other programmable logic devices or ASICs. Every site of the device that is capable of receiving a primitive is expressly identified. Each CLB has a site code, which is a bit vector having as many bits as there are site locations. Information describing which sites are occupied and which are free is stored in the CLB's site code.

The device supported by the physical package also includes a list of recognized primitives. Other primitives may be legal for the target device architecture, but only those listed below will be placeable under the current method scheme. Associated with each primitive type is information describing its physical properties. The data structure used to store physical properties of a primitive is described below:

primitive_physical_requirements_type includes:
  primitive_types identifies the type of primitive from the recognized set of primitives (e.g., the individual LUTs, muxes, and XOR elements of a Virtex CLB);
  site_code identifies the site at which the primitive was finally placed;
  logic_element_ptr, slice_ptr, and clb_ptr are three pointers, only one of which is used for a particular primitive. The one of the pointers that is used depends on the value assigned to the variable, occupies; and
  occupies is a pointer that points to the CLB (or segment within a CLB) that ultimately holds this primitive.

A logic_element is a data structure that holds the status of elements (e.g., LUT, flop, mux, XOR, multand) within one logic element of a slice of a CLB. A slice is a data structure that references the logic_element data structures comprising one slice of a CLB, along with the status of the slice-level element. A CLB is a data structure that references the slice data structures of one CLB along with the status of the CLB-level element.

Physical Package

The following procedures of the physical package are called by the procedures of the placement directive (a.k.a. abstract) package.

The construct_new_primitive procedure initializes the primitive data structure passed as a parameter with information about the physical properties of the selected primitive. The primitive parameter is the data structure (of type primitive_physical _requirements type) to be initialized with information describing the physical dimensions of a primitive. The primitive_type (of type, primitive_types) parameter is the primitive whose characteristics are to be described.

The construct_new_primitive command can be used to supplement the definitions of each of the primitives in the UNISIM library, for example, with information describing the physical dimensions of each primitive. For example, if the UNISIM library is copied once for each target device technology to create a UNISIM_4K library, a UNISIM_VIRTEX library, a UNISIM_5200 library, a UNISIM_CPLD library etc, the individual libraries initially only contain logical definitions of all the different primitives. Within each library, the primitives that are appropriate for that device technology need to be supplemented with the physical description used by the physical package whenever the dimensions of a primitive are requested. Thus, the construct_new_primitive command is available to initialize the primitives.

The get_primitive_boundary function returns the physical boundary associated with the selected primitive. The primitive (of type primitive_types) parameter identifies the primitive whose boundary is to be reported.

The get_logic_element_details procedure fills the logic_element parameter with information describing the physical implementation details of the primitive referenced by the primitive parameter (of type primitive_types). If the selected primitive does not fit within a logic_element boundary, an error message is generated.

The get_slice_details procedure fills the input slice parameter with information describing the physical implementation details of the primitive selected by the input primitive parameter.

The get_clb_details procedure fills the input slice parameter with information about the physical implementation details of the primitive selected by the input primitive parameter. If the selected primitive does not fit within a CLB boundary, an error message is generated.

The add_floorplan_segment_to_list procedure attaches the input floorplan_element parameter to the head of the list of temporarily unplaced floorplan elements.

The create_new_floorplan_element procedure creates a CLB data structure compatible with the physical requirements set forth in the input primitive parameter. The primitive is placed at the location specified by the placement_bias parameter or at a default location if no placement bias is provided. The floorplan element parameter is initialized with the CLB information.

The create_new_physical_container procedure creates a CLB data structure (physical_container_type) from the requirements set forth in the input primitive parameter. The primitive is placed at the location indicated by the input placement_bias parameter or placed at a default location within the CLB if no location is indicated by the parameter.

The add_clb_to_container procedure adds a CLB-boundary primitive to the input container parameter (physical_container_type). The physical requirements of the primitive are provided in the input unplaced_primitive parameter. The procedure first checks whether the target can accommodate the primitive. If no space is available, a warning message is generated and no action is taken.

The add_slice_to_container procedure adds a slice boundary primitive to a CLB. The input container parameter (physical_container_type) indicates the CLB to which the primitive is to be added, the input unplaced_primitive parameter sets for the physical requirements of the primitive to be added to the CLB, the input slice_number parameter identifies the slice of the CLB into which the primitive is to be placed. The procedure first checks whether target can accommodate the unplaced primitive. If no space is available, a warning message is generated and no action is taken. However, processing continues and the resulting floorplan, which may be illegal, can be analyzed.

The find_space_for_slice_in_container procedure scans all the slices in a CLB for space to place the specified primitive. The input container parameter (physical_container_type) specifies the CLB that is scanned, the input unplaced_primitive parameter sets forth the primitive for which space is being searched, and the output result parameter indicates whether space is available. If space is available in the container, the primitive is added to the container.

The add_logic_element_to_container procedure adds a logic element boundary primitive to a CLB. The container parameter (physical_container_type) is the CLB to which the primitive is to be added, the unplaced_primitive parameter sets forth the physical requirements of the primitive to be added to the CLB, the slice_number parameter identifies the slice of the CLB into which the primitive is to be placed, and the logic_element_number parameter identifies the logic element into which the primitive is to be placed. The procedure first tests whether the target CLB will accommodate the primitive. If no space is available, a warning message is generated and processing continues. The resulting floorplan, which may be illegal, can be analyzed.

The find_space_for_logic_element_in_container procedure scans the logic elements in a CLB for space to implement the specified primitive. The container parameter (physical_container_type) identifies the CLB having the logic elements that are scanned, the unplaced_primitive parameter sets for the primitive for which space is sought, and the output result parameter indicates whether space was available. If space is available in the container, the unplaced_primitive is placed in the container.

The merge_clbs procedure combines the primitives of two CLB data structures (physical_container_type) into a single CLB data structure. The target_clb parameter is the data structure in which the primitives are placed, and the new_clb parameter is the CLB having primitives to be merged into the target_clb.

The merge_slices procedure combines the primitives of two slice data structures into a single slice data structure. The target_slice parameter is the slice into which the primtives are combined, and the new_slice parameter is the slice having the primitive(s) to be combined into the target_slice.

The merge_logic_elements procedure combines the primitives of two logic element data structures into a single data structure. The target_slice parameter is the slice into which the primtives are combined, and the new_slice parameter is the slice having the primitive(s) to be combined into the target_slice.

The check_for_space_to_merge_clbs procedure checks whether the primitives of two CLB data structures can be combined into a single data structure. The parameters include references to two CLB data structures and a result that indicates whether the combination is possible.

The check_for_space_to_merge_slices procedure checks whether the primitives of two slice data structures can be combined into a single data structure. The parameters include references to two slice data structures and a result that indicates whether the combination is possible.

The check_for_space_to_merge_logic_elements procedure determines whether the logic of two logic element data structures can be combined into a single data structure. The parameters include references to two logic element data structures and a result that indicates whether the combination is possible.

The place_primitives procedure places an unplaced primitive relative to a placed primtive in accordance with a placement parameter. The placed_primtve parameter references the placed primitive, and the unplaced_primitive parameter references the primitive to be placed. The placed_primitive_floorplan parameter sets forth the floorplan details of the placed primitive, and the unplaced_primitive_floorplan parameter sets forth the floorplan details of the unplaced primitive. The boundary parameter specifies the boundary relationship imposed in placing the two primitives, the placement parameter sets forth the placement relationship to be imposed between the two primitives, and the possible_to_share parameter receives a Boolean value indicating whether the unplaced primitive was placed in the same CLB as the placed primitive.

Analysis Support Package

Analysis support package 254 includes the following functions and procedures in one embodiment.

The showtree procedure prints the physical hierarchy to an output device, for example, a display terminal. The output for the following example testbench is also set forth below.

The printplan2 procedure prints the floorplan of a referenced container to an output device. The floorplan output from printplan2 for the example testbench is also set forth below.

The htmltree procedure generates an HTML file that can be browsed to display both the hierarchy and floorplan of the referenced container.

Example Logic Core

The following code is VHDL for implementing an adder logic core. Comments that describe the code that relates to the placement directives begin with the characters, "—". For this example, the "create_container" and "place" placement directives are used to define the placement.

```
ENTITY adder IS
    GENERIC( bitwidth : INTEGER;
                    translate : translation_type );
    PORT(      a : IN std_logic_vector(bitwidth-1 DOWNTO 0);
               b : IN std_logic_vector(bitwidth-1 DOWNTO 0);
               o : OUT std_logic_vector(bitwidth-1 DOWNTO 0));
BEGIN
    create_container (adder'PATH_NAME, translate);
    -- Establish a container for the logic held by this
    -- ENTITY. Subsequent placement directives may then be
    -- used to place this ENTITY within the floorplan.
END ENTITY adder;
ARCHITECTURE u12_1 OF adder IS
    SIGNAL oo, ci : std_logic_vector(o'RANGE);
BEGIN
    ci (0) <= '0';
    g0 : FOR bit IN o'RANGE GENERATE
        u0 : 1ut2 GENERIC MAP ( "0110" )
                        PORT MAP (    i0 => a(bit),
                                      i1 => b(bit),
                                      o => oo(bit) );
            place( bit > 0, u0'PATH_NAME, above, iteration(bit-1,
                    u0'PATH_NAME) );
            -- For those iteratrions of g0 where bit > 0, place
            -- this iteration's instance U0 above the previous
            -- iteration's instance of U0. Ie. Create a vertical
            -- column of LUT2s.
        g01 : IF bit < o'LEFT GENERATE
            u1 : muxcy PORT MAP ( s => oo(bit),
                                    di => a(bit),
                                    ci => ci(bit),
                                    o => ci(bit+1) );
                place( u1'PATH_NAME, \with\,
                                parent_region
                                (u0'PATH_NAME) );
                        -- For those iterations of g0
                           where bit < the MSB
                        -- instantiate a MUXCY and
                           place it with this
                        -- iteration's instance of u0.
        END GENERATE g01;
        u2 : xorcy PORT MAP (       1i => oo(bit),
                                    ci => ci(bit),
                                    o => o(bit) );
            place( u2'PATH_NAME, \with\, u0'PATH_NAME );
            -- Place this iteration's instance u2 with this
            -- iteration's u0. Ie. Place this iteration's XORCY
            -- with this iteration's LUT2.
```

```
END GENERATE g0;
END ARCHITECTURE u12_1;
```

The following code sets forth an example testbench that can be used to test the behavior of and analyze the floorplan of the adder logic core defined above. Comments describing the testbench are interspersed in the code.

```
ENTITY testbench IS
BEGIN
    create_container(testbench'PATH_NAME);
    -- Define a container that will contain all the
    -- floorplanned objects in the design. Necessary so that
    -- we can request a display of the complete floorplan.
END ENTITY testbench;
ARCHITECTURE test OF testbench IS
    CONSTANT bw : INTEGER := 3;
    COMPONENT adder IS
        GENERIC( bitwidth : INTEGER;
                 translate : translation_type );
        PORT ( a : IN std_logic_vector
                    (bitwidth-1 DOWNTO 0);
               b : IN std_logic_vector
                    (bitwidth-1 DOWNTO 0);
               o : OUT std_logic_vector
                    (bitwidth-1 DOWNTO 0));
    END COMPONENT adder;
    SIGNAL a1, b1, o1 : std_logic_vector(bw-1 DOWNTO 0);
    SIGNAL a2, b2, o2 : std_logic_vector(bw-1 DOWNTO 0);
    SIGNAL a3, b3, o3 : std_logic_vector(bw-1 DOWNTO 0);
BEGIN
    uut1 : adder GENERIC MAP (   bitwidth => o1'LENGTH,
                                 translate => no_translation)
                 PORT MAP (      a => a1,
                                 b => b1,
                                 o => o1 );
    uut2 : adder GENERIC MAP (   bitwidth => o2'LENGTH,
                                 translate => (ninety_degrees,
                                             no_reflection) )
                 PORT MAP (      a => a2,
                                 b => b2,
                                 o => o2 );
    uut3 : adder GENERIC MAP (   bitwidth => o3'LENGTH,
                                 translate =>
                                 (oneeighty_degrees,
                                             no_reflection)
                 PORT MAP (      a => a3,
                                 b => b3,
                                 o => o3 );
    place(uut1'PATH_NAME, (to_left_of, bottom_aligned,
                         clb_boundary), uut2'PATH_NAME);
    place(uut3'PATH_NAME, (above, right aligned,
                         clb_boundary), uut2'PATH_NAME);
    -- Some sample placement constraints
        logical_stimulus : PROCESS
            CONSTANT maxval : INTEGER := (2**bw) -1;
        BEGIN
            FOR i IN 0 TO maxval LOOP
                a1 <= convert_int_to_slv(i, a1'LENGTH);
                a2 <= convert_int_to_slv(i MOD bw, a2'LENGTH);
                FOR j IN 0 TO maxval LOOP
                    b1 <= convert_int_to_slv(j, b1'LENGTH);
                    b2 <= convert_int_to_slv
                    (j MOD bw, b2'LENGTH);
                    WAIT FOR 100 NS;
                END LOOP;
            END LOOP;
            WAIT;
        END PROCESS logical_stimulus;
        physical_stimulus : PROCESS
        BEGIN
            WAIT FOR 0 NS;
                -- Necessary to ensure that all the placement
                -- directive commands are processed before printing
                -- out the floorplan details
            calculate_container_dimensions;
                -- Figure-out the floorplan dimensions showtree;
                -- Print the physical hierarchy details on the
                -- simulator console
            printplan2 (container_tree);
                -- Print a 'detailed' floorplan on the simulator
                -- console
            htmltree (container_tree, "browser");
                -- Write a HTML floorplan browser file to the
                -- subdirectory 'browser'
            WAIT;
        END PROCESS physical_stimulus;
    END ARCHITECTURE test;
    CONFIGURATION cfg_testbench OF testbench IS
        FOR test
        END FOR;
END CONFIGURATION cfg_testbench;
```

The following text is output data produced from compilation and functional simulation of the adder core and testbench described above. At the end of the simulation data, two representations of the physical placement are output. The first representation sets forth the physical hierarchy of logic objects placed from the testbench, and the second representation sets forth a CLB-based graphical representation of the placement. It will be appreciated that in another embodiment, the placement information can be output to a file for subsequent analysis. For example, the placement information may be saved as HTML data that is suitable for viewing with browser software.

```
# Model Technology ModelSim PE vcom 5.2e Compiler 1999.04
Apr. 11, 1999
# -- Loading package standard
# -- Loading package std_logic_1164
# -- Loading package textio
# -- Loading package utils
# -- Loading package physical
# -- Loading package abstract
# -- Loading package unisim_comps
# -- Compiling entity adder
# -- Compiling architecture u12_1 of adder
# -- Loading entity lut2
# -- Loading entity muxcy
# -- Loading entity xorcy
vcom testbench.vhd
# Model Technology ModelSim PE vcom 5.2e Compiler 1999.04
Apr. 11, 1999
# -- Loading package standard
# -- Loading package std_logic_1164
# -- Loading package simutils
# -- Loading package textio
# -- Loading package utils
# -- Loading package physical
# -- Loading package abstract
# -- Loading package analysis
# -- Compiling entity testbench
# -- Compiling architecture test of testbench
# -- Loading package unisim_comps
# -- Loading entity adder
# -- Compiling configuration cfg_testbench
# -- Loading entity testbench
# -- Loading architecture of testbench
vsim cfg_testbench
```

-continued

```
# vsim cfg_testbench
# Loading C:/PROGRAM FILES/MODELTECH/WIN32PE/../std,standard
# Loading C:/PROGRAM
FILES/MODELTECH/WIN32PE/../ieee.std_logic_1164(body)
# Loading u12.simutils (body)
# Loading C:/PROGRAM
FILES/MODELTECH/WIN32PE/../std.textio (body)
# Loading u12.utils (body)
# Loading u12.physical (body)
# Loading u12.abstract (body)
# Loading u12.analysis (body)
# Loading u12.unisim_comps
# Loading work.crg_testbench
# Loading work.testbench (test)
# Loading work.adder (u12_1)
# Loading u12.lut2 (u12_sim)
# Loading u12.xorcy (u12_sim)
# Loading u12.muxcy (u12_sim)
run
# Calculating container dimensions...
# Finished.
# Displaying physical hierarchy.
# [C] :testbench:
#  +--[C] :testbench:uut3:
#  |    +--[P] :testbench:uut3:g0 (0) :u2:
#  |    +--[P] :testbench:uut3:g0 (2) :u0:
#  |    +--[P] :testbench:uut3:g0 (2) :u2:
#  |    +--[P] :testbench:uut3:g0 (1) :u0:
#  |    +--[P] :testbench:uut3:g0 (1) :g01:u1:
#  |    +--[P] :testbench:uut3:g0 (1) :u2:
#  |    +--[P] :testbench:uut3:g0 (0) :u0:
#  |    +--[P] :testbench:uut3:g0 (0) :g01:u1:
#  |
#  +--[C] :testbench:uut1:
#  |    +--[P] :testbench:uut1:g0 (2) :u0:
#  |    +--[P] :testbench:uut1:g0 (2) :u2:
#  |    +--[P] :testbench:uut1:g0 (1) :u0:
#  |    +--[P] :testbench:uut1:g0 (1) :g01:u1:
#  |    +--[P] :testbench:uut1:g0 (1) :u2:
#  |    +--[P] :testbench:uut1:g0 (0) :u0:
#  |    +--[P] :testbench:uut1:g0 (0) :g01:u1:
#  |    +--[P] :testbench:uut1:g0 (0) :u2:
#  |
#  +--[C] :testbench:uut2:
#       +--[P] :testbench:uut1:g0 (2) :u0:
#       +--[P] :testbench:uut1:g0 (2) :u2:
#       +--[P] :testbench:uut1:g0 (1) :u0:
#       +--[P] :testbench:uut1:g0 (1) :g01:u1:
#       +--[P] :testbench:uut1:g0 (1) :u2:
#       +--[P] :testbench:uut1:g0 (0) :u0:
#       +--[P] :testbench:uut1:g0 (0) :g01:u1:
#       +--[P] :testbench:uut1:g0 (0) :u2:

# Printing detailed view of floorplanned container to
console.
# Detailed view of container :testbench:...
# Dimensions: 3 CLBs wide, 3 CLBs high.
#+===========+===========+===========+
#|           |           |           |
#|           |           | L MX      |
#|-----+-----+-----+-----+-----+-----+
#|           |           |           |
#|           |           | L MX      |
#+===========+===========+===========+
#|           |           |           |
#|           |           | L  X      |
#|-----+-----+-----+-----+-----+-----+
#|           |           |           |
#| L  X      |           |           |
#+===========+===========+===========+
#|           |           |           |
#| L MX      | L MX  L MX| L  X      |
#|-----+-----+-----+-----+-----+-----+
#|           |           |           |
#| L MX      |           |           |
#+===========+===========+===========+
```

-continued

```
# Done.
# Dumping detailed HTML floorplan view to file
browser/index.htm...
# Done.
```

FIGS. 4–7 are snapshots of a display screen as driven by browser software in reading placement characteristics in HTML format for the above-described testbench and adder core. The figures generally illustrate an example screen layout for a physical hierarchical relationship between design objects in conjunction with a graphical floorplan as viewed from different reference points within the hierarchy.

Figure 4:
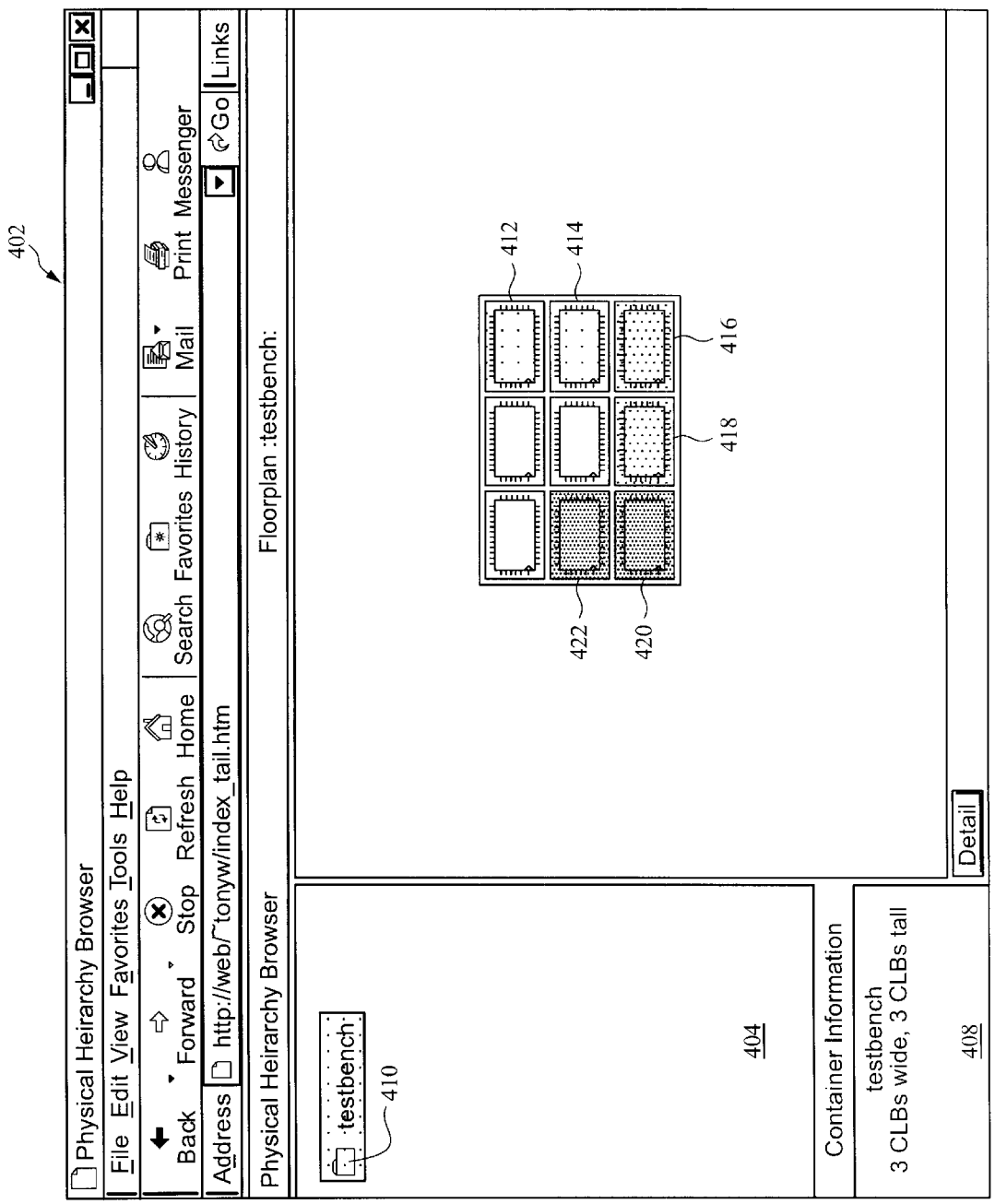
FIG. 4 is a snapshot of a display screen showing the top-level of the physical hierarchy along with the top-level floorplan of the testbench.

FIG. 4 is a snapshot of a display screen showing the top-level of the physical hierarchy along with the top-level floorplan of the testbench. The snapshot shows window 402 (generated by browser software, for example), which includes hierarchy portion 404 and floorplan portion 406. The data displayed in hierarchy portion 404 shows the hierarchical relationship between design objects of the above-described example testbench, and the data displayed in floorplan portion 406 shows the positional relationship between the testbench design objects relative to resources of a target device. The target device in this example is a Virtex FPGA. Portion 408 provides a textual description of the placement of the testbench.

The testbench in hierarchy portion 404 is associated with folder icon 410, which can be selected to provide further details on the elements and relationships of the testbench hierarchy. The floorplan of the testbench is illustrated in floorplan portion 406 and includes 9 CLBS. While the floorplan includes 9 CLBS, the actual number of CLBs that are used by the testbench is 6 as indicated by shaded blocks 412, 414, 416, 418, 420, and 422.

Figure 5:
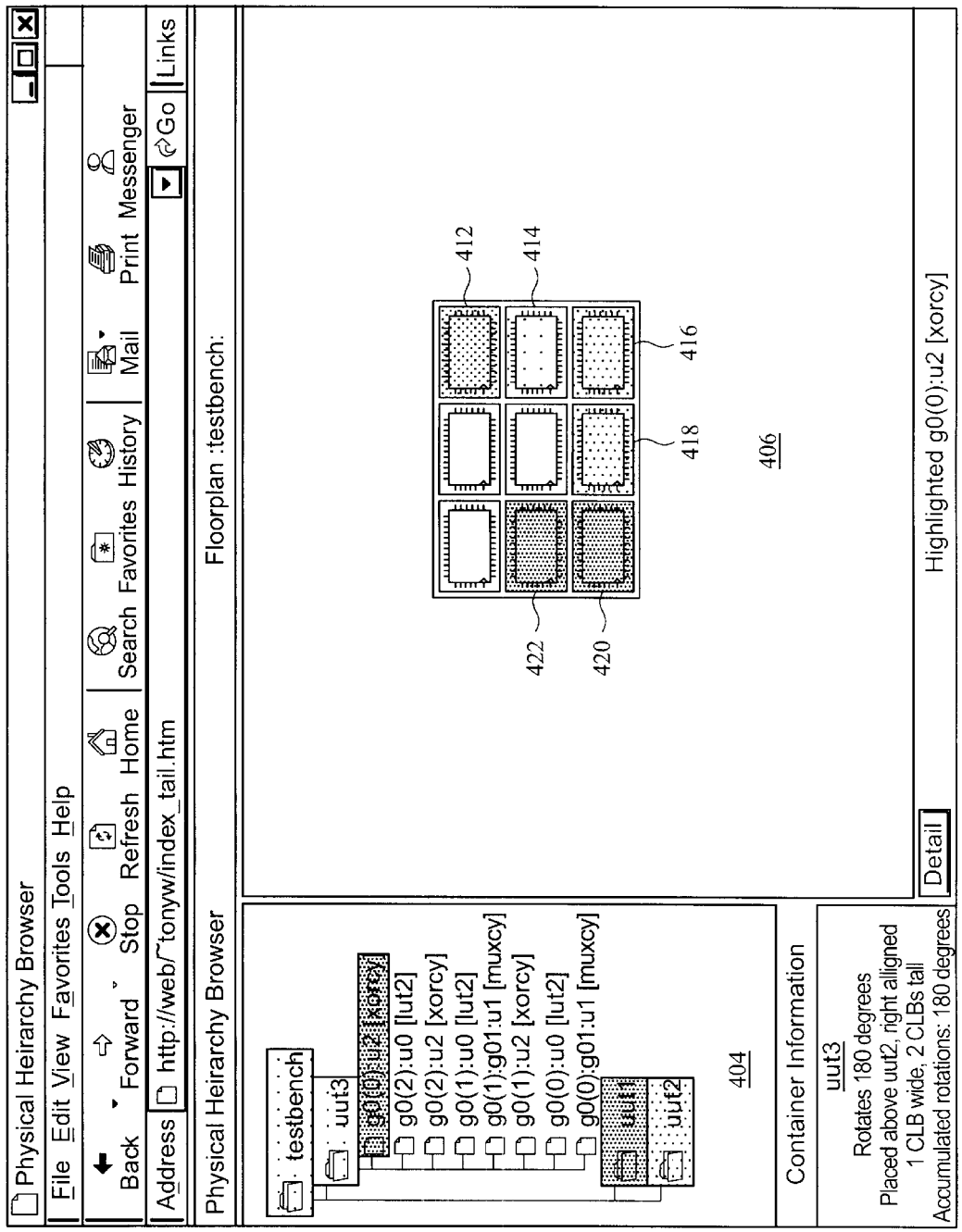
FIG. 5 is a snapshot of a display screen showing the expansion of the physical hierarchy for the testbench along with the design objects included in uut3.

FIG. 5 is a snapshot of a display screen showing the expansion of the physical hierarchy for the testbench along with the design objects included in uut3. The objects, uut1, uut2, and uut3 can be color coded or shaded to correspond in the floorplan to the CLBs on in which the objects are placed. For example, uut1 is associated with blocks 420 and 422, uut2 is associated with blocks 416 and 418, and uut3 is associated with blocks 412 and 414. Note that block 412 is darkened since the design object, g0(0):u2[xorcy], of uut3 has been selected. It will be appreciated that various color codes could be used for indicating placement of design objects.

Hierarchical portion 404 shows that the hierarchy of the testbench has been expanded to its constituent design objects, uut3, uut1, and uut2. Each of objects uut1, uut2, and uut3 have associated therewith folder icons that can be selected for further showing the details of the hierarchy. The hierarchy of the uut3 object is shown.

The primitives of a design can be uniquely identified by the unique positions of the primitives in the design's logical hierarchy. For example, the message "g0(1):g01:u1 [muxcy]" indicates that there is a primitive in this design of type muxcy which can be found in the logical hierarchy at location "g0(1):g01:u1". This primitive also exists in the physical hierarchy at location "testbench:uut3".

Figure 6:
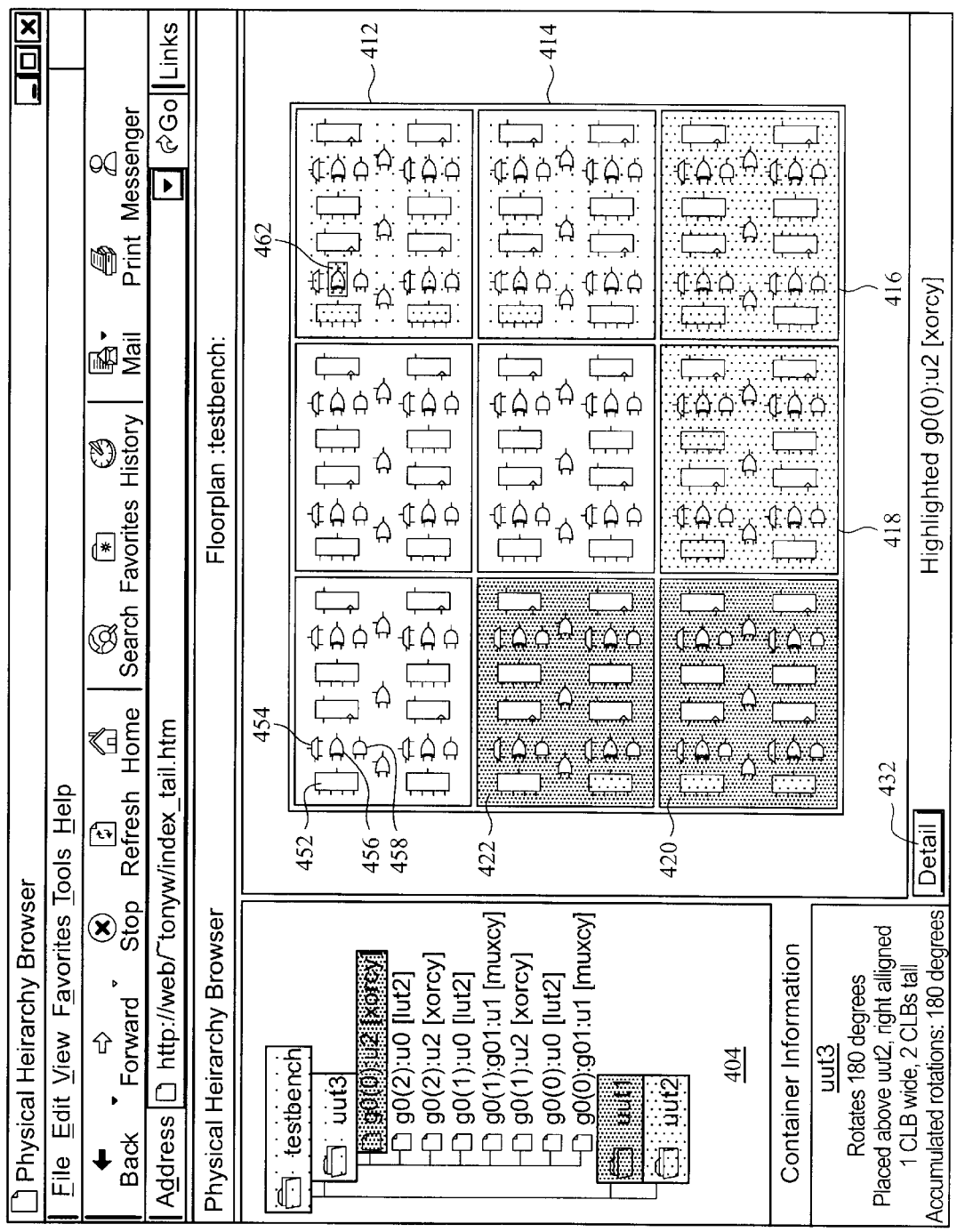
FIG. 6 is a snapshot of a display screen showing CLB details in conjunction with highlighted logic objects in the CLBs.

FIG. 6 is a snapshot of a display screen showing CLB details in conjunction with highlighted logic elements in the CLBS. The details shown in FIG. 6 can be displayed by pressing button 432, for example. Symbols within each CLB represent the various programmable resources. For example, symbol 452 represents a lookup table (LUT), symbol 454 represents a multiplexer, symbol 456 represents an XOR gate, and symbol 458 represents an AND gate. The shaded symbols within each of CLBs 412, 414, 416, 418, 420, and 422 indicate that the programmable resource is used by a design object of the testbench. Within CLB 412, symbol 462 is further highlighted to correspond to the highlighted design object, g0(0):u2[xorcy], in hierarchy portion 404.

For the purpose of analyzing the physical layout of a design it is as important to consider the space that is empty as well as the space that is occupied. Furthermore, the overall outline of the floorplan is of significance when considering how to stack multiple cores together. For these reasons, all the details of the square area bounded by the design's rectangular dimensions are shown in the CLB view of the display of FIG. 6.

Figure 7:
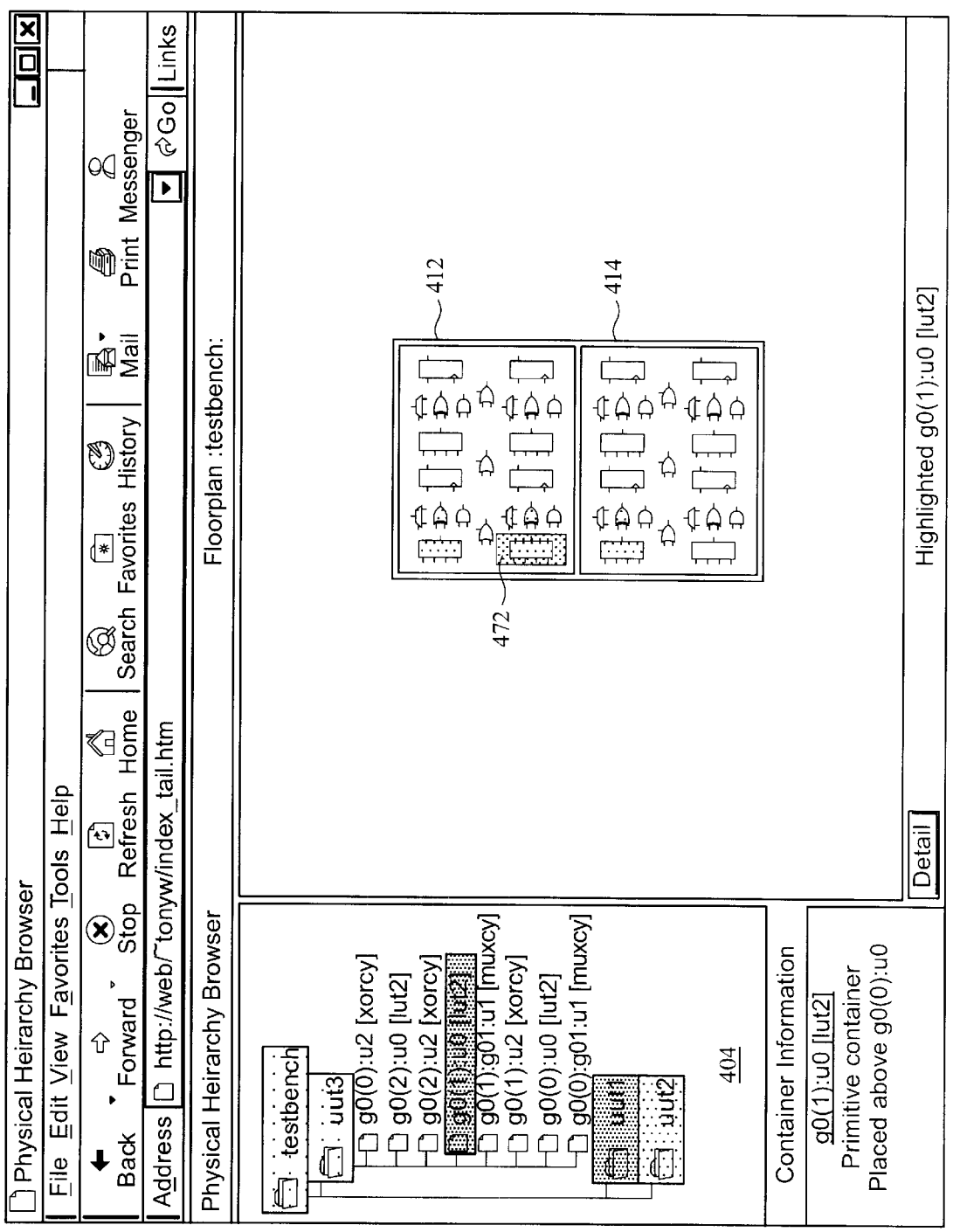
FIG. 7 is a snapshot of a display screen showing details of CLBs 412 and 414 of FIG. 6.

FIG. 7 is a snapshot of a display screen showing details of CLBs 412 and 414. Symbol 472 is highlighted to correspond to the highlighted design object, g0(1):u0[1ut2] in hierarchy portion 404.

Accordingly, the present invention provides, among other aspects, a system and method for creating reusable design modules for electronic circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for generating a placement for a circuit design, wherein the circuit design is comprised of a logical hierarchy of design objects, comprising:

establishing a physical hierarchy of objects in terms of selected objects from the logical hierarchy in response to directives set forth in a hardware definition language, wherein the physical hierarchy is different from the logical hierarchy;

establishing placement relationships between the objects in the physical hierarchy in response to directives set forth in a hardware definition language; and generating a placement responsive to the placement relationships established for the physical hierarchy.

2. The method of claim 1, wherein the directives defining the placement relationships include specification of an object above another object in the physical hierarchy, an object below another object in the physical hierarchy, an object to the left of another object in the physical hierarchy, and an object to the right of another object in the physical hierarchy.

3. The method of claim 1, wherein the directives defining the placement relationships include specification of a reflection of an object in the physical hierarchy.

4. A computer-implemented method for generating a placement for a circuit design, wherein the circuit design is comprised of a logical hierarchy of design objects, comprising:

establishing a physical hierarchy of objects in terms of selected objects from the logical hierarchy in response to directives set forth in a hardware definition language, wherein the physical hierarchy is different from the logical hierarchy;

establishing placement relationships between the objects in the physical hierarchy in response to directives set forth in a hardware definition language, including specification of a rotation of an object in the physical hierarchy; and generating a placement responsive to the placement relationships established for the physical hierarchy.

5. The method of claim 4, wherein the rotation of an object is specified in increments of 90 degrees.

6. In a system including a functional simulator that simulates functionality of a circuit design set forth in hardware description language code in conjunction with a test bench coded in the hardware description language, a computer-implemented method of providing design support, comprising:

generating functional simulation results from the circuit design and test bench;

interpreting directives that define placement characteristics of the circuit design, wherein the directives are set forth in hardware description language code; and generating, prior to synthesis of the circuit design and in response to the directives, a representation of the placement characteristics that supports graphical depiction of the placement characteristics, whereby functional aspects of the circuit design can be evolved in parallel with placement characteristics.

7. The method of claim 6, wherein the placement characteristics include a floorplan representation.

8. The method of claim 6, wherein the placement characteristics include a representation of a hierarchical relationship between objects in the design.

9. The method of claim 6, wherein the placement characteristics include a floorplan representation and a representation of a hierarchical relationship between objects in the design.

10. The method of claim 6, further comprising generating the placement characteristics in response to directives that define relative positions of objects in the design.

11. The method of claim 6, further comprising generating the placement characteristics in response to directives that translate positional relationships of objects in the design.

12. The method of claim 11, wherein translation of positional relationships includes rotating an object.

13. The method of claim 11, wherein translation of positional relationships includes reflecting an object.

14. The method of claim 6, wherein the representation of the selected placement characteristics is in hypertext markup language.

15. The method of claim 6, wherein the representation of the selected placement characteristics is in Javascript.

16. The method of claim 6, wherein the representation of the selected placement characteristics is in extensible markup language.

17. The method of claim 6, wherein the device is a field programmable gate array.

18. An application programming interface supporting analysis of placement characteristics of a circuit design during logic simulation, comprising:

a first set of procedures callable from code of a hardware definition language, the first set of procedures configured to generate descriptions for placement characteristics for a circuit design specified in the code of the hardware definition language;

a second set of procedures callable from the first set of procedures, the second set of procedures configured to generate placement data suitable for a selected device; and a third set of procedures callable from code of a hardware definition language, the third set of procedures configured to generate placement characteristics in a format that is viewable via a graphical user interface.

19. The application programming interface of claim 18, wherein the format of the placement characteristics is a markup language.

20. The application programming interface of claim 18, wherein the descriptions of the selected placement characteristics is in Javascript.

21. The application programming interface of claim 18, wherein the device is a field programmable gate array.

22. The application programming interface of claim 18, wherein the placement characteristics include a floorplan representation.

23. The application programming interface of claim 18, wherein the placement characteristics include a representation of a hierarchical relationship between objects in the design.

24. The application programming interface of claim 18, wherein the placement characteristics include a floorplan representation and a representation of a hierarchical relationship between objects in the design.

25. The application programming interface of claim 18, further comprising generating the placement characteristics in response to directives that define relative positions of objects in the design.

26. The application programming interface of claim 18, further comprising generating the placement characteristics in response to directives that translate positional relationships of objects in the design.

27. The application programming interface of claim 26, wherein translation of positional relationships includes rotating an object.

28. The application programming interface of claim 26, wherein translation of positional relationships includes reflecting an object.

29. In a system including a functional simulator that simulates functionality of a circuit design set forth in hardware description language code in conjunction with a test bench coded in the hardware description language, an apparatus for providing design support, comprising:

means for generating functional simulation results from the circuit design and test bench;

means for interpreting directives that define placement characteristics of the design, wherein the directives are set forth in hardware description language code; and means for generating, prior to synthesis of the circuit design and in response to the directives, a representation of the placement characteristics that supports graphical depiction of the placement characteristics, whereby functional aspects of the circuit design can be evolved in parallel with placement characteristics.

* * * * *